(12) United States Patent
Oikawa et al.

(10) Patent No.: US 12,370,578 B2
(45) Date of Patent: Jul. 29, 2025

(54) SUBSTRATE CLEANING APPARATUS AND SUBSTRATE CLEANING METHOD

(71) Applicant: EBARA CORPORATION, Tokyo (JP)

(72) Inventors: Fumitoshi Oikawa, Tokyo (JP); Koichi Fukaya, Tokyo (JP); Mitsuru Miyazaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 6 days.

(21) Appl. No.: 18/261,697

(22) PCT Filed: Dec. 14, 2021

(86) PCT No.: PCT/JP2021/045970
§ 371 (c)(1),
(2) Date: Jul. 17, 2023

(87) PCT Pub. No.: WO2022/158171
PCT Pub. Date: Jul. 28, 2022

(65) Prior Publication Data
US 2024/0075503 A1    Mar. 7, 2024

(30) Foreign Application Priority Data

Jan. 25, 2021   (JP) .................. 2021-009240

(51) Int. Cl.
*B08B 1/32*   (2024.01)
*B08B 1/20*   (2024.01)
(Continued)

(52) U.S. Cl.
CPC ............... *B08B 1/32* (2024.01); *B08B 1/20* (2024.01); *B08B 3/041* (2013.01); *H01L 21/67046* (2013.01)

(58) Field of Classification Search
None
See application file for complete search history.

(56) References Cited

U.S. PATENT DOCUMENTS

| | | | |
|---|---|---|---|
| 2002/0022445 A1* | 2/2002 | Sotozaki | B08B 1/34 |
| | | | 451/444 |
| 2017/0236730 A1 | 8/2017 | Imamura et al. | |
| 2021/0362198 A1* | 11/2021 | Lee | A46B 13/02 |

FOREIGN PATENT DOCUMENTS

| | | | | |
|---|---|---|---|---|
| JP | 2002-313767 A | | 10/2002 | |
| JP | 2008311481 | * | 12/2008 | ........... H01L 21/304 |

(Continued)

OTHER PUBLICATIONS

JP 2008311481 English translation, accessed on Sep. 2024. (Year: 2008).*

(Continued)

*Primary Examiner* — Eric W Golightly
*Assistant Examiner* — Arlyn I Rivera-Cordero
(74) *Attorney, Agent, or Firm* — Chrisman Gallo Tochtrop LLC

(57) ABSTRACT

A substrate cleaning apparatus includes a substrate rotation supporting section that supports and rotates a substrate; a roll holding section that rotatably holds a first roll cleaning member and a second roll cleaning member each having a length almost equal to a radius of the substrate; a roll rotation drive section that rotates the first roll cleaning member and the second roll cleaning member about respective axes of rotation parallel to a front surface of the substrate; and a roll pressing section that brings the first roll cleaning member and the second roll cleaning member that are rotating into sliding contact with the front surface of the substrate. The first roll cleaning member and the second roll cleaning member are disposed so as to cover different radial parts of the front surface of the substrate.

19 Claims, 12 Drawing Sheets

(51) Int. Cl.
*B08B 3/04* (2006.01)
*H01L 21/67* (2006.01)

(56) References Cited

FOREIGN PATENT DOCUMENTS

| | | |
|---|---|---|
| JP | 2010-212295 A | 9/2010 |
| JP | 2017-147275 A | 8/2017 |

OTHER PUBLICATIONS

International Search Report issued in Patent Application No. PCT/JP2021/045970 dated Mar. 22, 2022. 5 Pages

* cited by examiner

SUBSTRATE CLEANING APPARATUS AND SUBSTRATE CLEANING METHOD

TECHNICAL FIELD

The present disclosure relates to a substrate cleaning apparatus and a substrate cleaning method.

BACKGROUND ART

Conventionally, there is a scrub-cleaning apparatus as a cleaning apparatus that cleans a semiconductor substrate. This apparatus has a substrate rotation supporting section that holds and rotates a semiconductor substrate, which is an object to be cleaned, a roll sponge that rotates about an axis parallel to a surface of the substrate, and a cleaning solution nozzle that supplies a cleaning solution to a surface to be cleaned of the substrate. The substrate rotation supporting section rotates while supporting the outer periphery of the substrate, the rotational force is transmitted to the outer side surface of the substrate, and the substrate is rotated. The roll sponge rotates about its axis of rotation, and cleans the front surface of the substrate while sliding on the front surface.

In the conventional roll cleaning apparatus, the length of the roll cleaning member is a length extending over the diameter of the substrate. In this case, due to the relative relationship between the rotation direction of the substrate and the rotation direction of the roll cleaning member, the sliding direction of the roll cleaning member is in the same direction as the sliding direction of the substrate at the sliding contact interface between the roll cleaning member and the substrate in a radial region on one side on the axis of the roll cleaning member. In this region, the roll cleaning member that is rotating acts to receive particles on the substrate and wind up the particles onto the substrate. Therefore, the roll cleaning member hardly contributes to cleaning of the substrate and, to the contrary, has an effect of causing re-adhesion of particles to the substrate from the roll cleaning member.

JP 2002-313767 A discloses that a length of a roll cleaning member extending in a direction parallel to a substrate is set to a length extending over the radius of the substrate, and the sliding direction of the roll cleaning member is set opposite to the sliding direction of the substrate at the sliding contact interface between the roll cleaning member and the substrate. However, the required specifications for cleaning performance are increasing year by year, and further improvement is required.

SUMMARY OF INVENTION

It is desirable to provide a substrate cleaning apparatus and a substrate cleaning method that can improve particle removal ability.

A substrate cleaning apparatus according to one aspect of the present disclosure includes: a substrate rotation supporting section that supports and rotates a substrate; a roll cleaning member holding section that rotatably holds a first roll cleaning member and a second roll cleaning member each having a length almost equal to a radius of the substrate; a roll rotation drive section that rotates the first roll cleaning member and the second roll cleaning member about respective axes of rotation parallel to a front surface of the substrate; and a roll pressing section that brings the first roll cleaning member and the second roll cleaning member that are rotating into sliding contact with the front surface of the substrate, wherein the first roll cleaning member and the second roll cleaning member are disposed so as to cover different radial parts of the front surface of the substrate.

A substrate processing method according to one aspect of the present invention includes: disposing a first roll cleaning member and a second roll cleaning member each having a length almost equal to a radius of a substrate so as to cover different radial parts of a front surface of the substrate; and bringing the first roll cleaning member and the second roll cleaning member into sliding contact with the front surface of the substrate while rotating the substrate and rotating the first roll cleaning member and the second roll cleaning member about respective axes of rotation parallel to the front surface of the substrate.

DESCRIPTION OF EMBODIMENT

Figure 1:
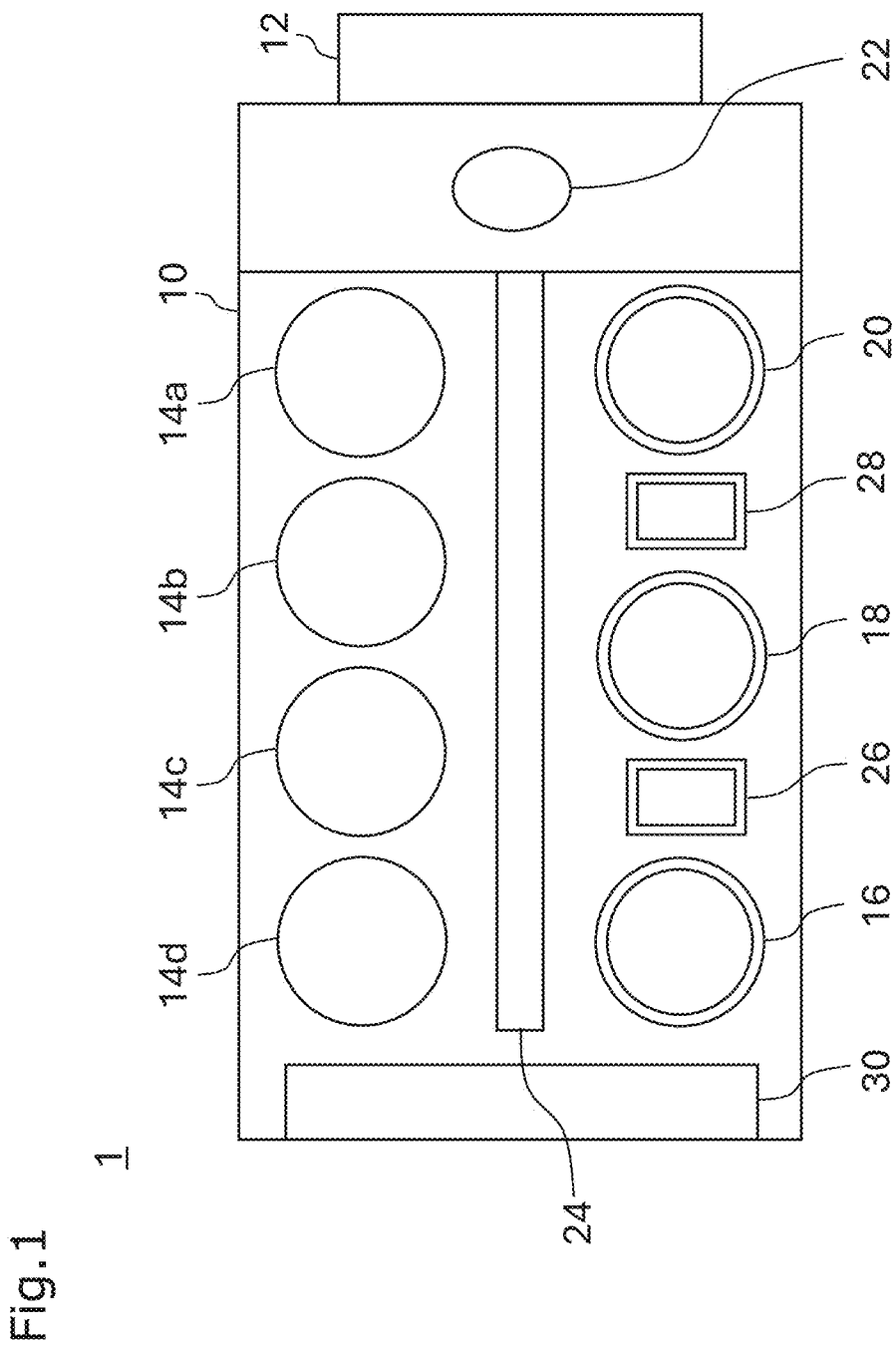
FIG. 1 is a plan view illustrating an overall configuration of a substrate processing apparatus according to one embodiment.

A substrate cleaning apparatus according to a first aspect of an embodiment includes: a substrate rotation supporting section that supports and rotates a substrate; a roll cleaning member holding section that rotatably holds a first roll cleaning member and a second roll cleaning member each having a length almost equal to a radius of the substrate; a roll rotation drive section that rotates the first roll cleaning member and the second roll cleaning member about respective axes of rotation parallel to a front surface of the substrate; and a roll pressing section that brings the first roll cleaning member and the second roll cleaning member that are rotating into sliding contact with the front surface of the substrate, wherein the first roll cleaning member and the second roll cleaning member are disposed so as to cover different radial parts of the front surface of the substrate.

According to such an aspect, by bringing the first roll cleaning member and the second roll cleaning member into sliding contact with the front surface of the substrate while rotating each of the substrate, the first roll cleaning member, and the second roll cleaning member, the front surface of the substrate is to be cleaned twice by the first roll cleaning member and the second roll cleaning member during a single rotation. Accordingly, the particle removal ability can be improved by a factor of two.

A substrate cleaning apparatus according to a second aspect of the embodiment is the substrate cleaning apparatus according to the first aspect, in which the roll rotation drive section rotates the first roll cleaning member and the second roll cleaning member in such a direction that a sliding direction of the first roll cleaning member is opposite to a sliding direction of the substrate at a sliding contact interface between the first roll cleaning member and the substrate and a sliding direction of the second roll cleaning member is opposite to a sliding direction of the substrate at a sliding contact interface between the second roll cleaning member and the substrate.

According to such an aspect, when the first roll cleaning member and the second roll cleaning member clean the substrate while bringing the substrate that is rotating into contact with the cleaning members that are rotating about their axes, the first roll cleaning member and the second roll cleaning member rotate to face the particles on the substrate that is relatively approaching the cleaning members and sweep the particles up and away and hence, the particle removal ability can be improved.

A substrate cleaning apparatus according to a third aspect of the embodiment is the substrate cleaning apparatus according to the first or second aspect, in which an axis of rotation of the first roll cleaning member and an axis of rotation of the second roll cleaning member are in parallel with each other, and the first roll cleaning member and the second roll cleaning member are disposed so as to cover opposite radial parts of the front surface of the substrate across a center of the substrate.

According to such an aspect, it is easy to have the same roll rotation holding section hold the first roll cleaning member and the second roll cleaning member, which can simplify the apparatus configuration.

A substrate cleaning apparatus according to a fourth aspect of the embodiment is the substrate cleaning apparatus according to any one of the first to third aspects, in which the roll rotation drive section rotates the first roll cleaning member and the second roll cleaning member at different rotational speeds.

According to such an aspect, the relative velocity at the sliding contact interface between the first roll cleaning member and the substrate can be made different from the relative velocity at the sliding contact interface between the second roll cleaning member and the substrate. Accordingly, it is possible to realize a removal action that depends on the size of the particles, and to immediately remove the particles re-adhered to the substrate from the roll cleaning members. Therefore, the particle removal ability can be improved.

A substrate cleaning apparatus according to a fifth aspect of the embodiment is the substrate cleaning apparatus according to any one of the first to fourth aspects, in which the roll rotation drive section has a motor that rotates the first roll cleaning member and the second roll cleaning member, the substrate cleaning apparatus has a control apparatus that controls the roll pressing section, and the control apparatus receives a signal of load torque of the motor, and controls the roll pressing section, in a case where the load torque of the motor exceeds a preset upper limit value, so as to separate the first roll cleaning member and the second roll cleaning member from the substrate by a distance corresponding to a difference between the upper limit value and the load torque of the motor, and in a case where the load torque of the motor falls below a preset lower limit value, so as to bring the first roll cleaning member and the second roll cleaning member close to the substrate by a distance corresponding to a difference between the lower limit value and the load torque of the motor.

According to such an aspect, by keeping the load torque of the motor within a predetermined certain fixed range, the pressing situation of the roll cleaning members with respect to the front surface of the substrate can be kept within a certain fixed range and hence, stable cleaning performance can be maintained.

A substrate cleaning apparatus according to a sixth aspect of the embodiment is the substrate cleaning apparatus according to any one of the first to fifth aspects, in which the roll pressing section has: a first pressing section that brings the first roll cleaning member and the second roll cleaning member into sliding contact with the front surface of the substrate by applying a load to the roll cleaning member holding section in a direction perpendicular to the front surface of the substrate; and a second pressing section that makes a pressing load of the first roll cleaning member different from a pressing load of the second roll cleaning member with respect to the front surface of the substrate by tilting the roll holding section with respect to the front surface of the substrate.

According to such an aspect, by providing a difference in pressing loads of the plurality of roll cleaning members with respect to the substrate and performing scrub-cleaning using the first roll cleaning member and the second roll cleaning member, it is possible to realize a removal action that depends on the size of the particles, and to immediately remove the particles re-adhered to the substrate from the roll cleaning members. Therefore, the particle removal ability can be improved.

A substrate cleaning apparatus according to a seventh aspect of the embodiment is the substrate cleaning apparatus according to any one of the first to sixth aspects, in which the roll rotation drive section has a first motor that rotates the first roll cleaning member, and a second motor that rotates the second roll cleaning member.

According to such an aspect, the rotational speed of the first roll cleaning member is easily made different from the rotational speed of the second roll cleaning member.

A substrate cleaning apparatus according to an eighth aspect of the embodiment is the substrate cleaning apparatus according to the seventh aspect, further includes a control apparatus that receives a signal of load torque of each of the first motor and the second motor, and controls the roll pressing section, in a case where the load torque of the first motor exceeds a preset first upper limit value, so as to separate the first roll cleaning member from the substrate by a distance corresponding to a difference between the first upper limit value and the load torque of the first motor, in a case where the load torque of the first motor falls below a preset first lower limit value, so as to bring the first roll cleaning member close to the substrate by a distance corresponding to a difference between the first lower limit value and the load torque of the first motor, in a case where the load torque of the second motor exceeds a preset second upper limit value, so as to separate the second roll cleaning member from the substrate by a distance corresponding to a difference between the second upper limit value and the load torque of the second motor, and in a case where the load torque of the second motor falls below a preset second lower limit value, so as to bring the second roll cleaning member close to the substrate by a distance corresponding to a difference between the second lower limit value and the load torque of the second motor.

According to such an aspect, by keeping the load torque of the motor within a predetermined certain fixed range, the pressing situation of the roll cleaning members with respect to the front surface of the substrate can be kept within a certain fixed range and hence, stable cleaning performance can be maintained.

A substrate cleaning apparatus according to a ninth aspect of the embodiment is the substrate cleaning apparatus according to any one of the first to sixth aspects, in which the roll rotation drive section has a first motor that rotates the first roll cleaning member, and a power transmission section that transmits rotation of the first roll cleaning member to the second roll cleaning member.

According to such an aspect, power can be transmitted to the two roll cleaning members without installing two motors and hence, for example, space can be saved, and the weight of the apparatus can be reduced.

A substrate cleaning apparatus according to a tenth aspect of the embodiment is the substrate cleaning apparatus according to any one of the first to ninth aspects, further includes a roll parallel movement section that integrally moves the first roll cleaning member and the second roll cleaning member in a direction parallel to the front surface of the substrate.

According to such an aspect, even if the axes of rotation of the roll cleaning members are not disposed to overlap with the diameter of the substrate in a plan view, the roll cleaning members can be brought into sliding contact with the center part of the substrate by performing cleaning while reciprocating the roll cleaning members in a direction orthogonal to the axes of rotation of the roll cleaning members. Therefore, the center part of the substrate can also be cleaned evenly. Furthermore, in the conventional apparatus, cleaning is performed only in an arrangement in which the axis of rotation of the roll cleaning member is disposed to overlap with the diameter of the substrate in a plan view. Therefore, the position of nodules (bumps) provided on the outer circumference of the surface of the roll cleaning member takes a fixed position in distance from the center of the substrate in the radial direction, and the number of contacts of the nodules is unevenly distributed depending on the position in the radial direction. Therefore, the time until the end of cleaning is determined at a position where the number of contacts of the nodules is small. On the other hand, according to such an aspect, cleaning is performed while reciprocating the roll cleaning members in a direction orthogonal to the axes of rotation of the roll cleaning members. Therefore, the position of nodules provided on the outer circumference of the surface of the roll cleaning member varies in distance from the center of the substrate in the radial direction, and uneven distribution of the number of contacts of the nodules depending on the position in the radial direction is suppressed, and the time until the end of cleaning can be relatively shortened.

A substrate cleaning apparatus according to an eleventh aspect of the embodiment is the substrate cleaning apparatus according to any one of the first to tenth aspects, further includes a cleaning solution nozzle that supplies a cleaning solution to the front surface of the substrate.

A substrate cleaning apparatus according to a twelfth aspect of the embodiment is the substrate cleaning apparatus according to the eleventh aspect, in which the cleaning solution nozzle has a first cleaning solution nozzle that supplies a cleaning solution to the sliding contact interface between the first roll cleaning member and the substrate, and a second cleaning solution nozzle that supplies a cleaning solution to the sliding contact interface between the second roll cleaning member and the substrate.

According to such an aspect, the cleaning solution can be efficiently supplied to the sliding contact interface between each roll cleaning member and the substrate.

A substrate cleaning apparatus according to a thirteenth aspect of the embodiment is the substrate cleaning apparatus according to the twelfth aspect, in which the first cleaning solution nozzle supplies the cleaning solution to the sliding contact interface between the first roll cleaning member and the substrate from an upstream side of the substrate in a rotation direction, and the second cleaning solution nozzle supplies the cleaning solution to the sliding contact interface between the second roll cleaning member and the substrate from the upstream side of the substrate in the rotation direction.

According to such an aspect, the cleaning solution can be more efficiently supplied to the sliding contact interface between each roll cleaning member and the substrate.

A substrate cleaning apparatus according to a fourteenth aspect of the embodiment is the substrate cleaning apparatus according to any one of the eleventh to thirteenth aspects, in which the cleaning solution nozzle has a third cleaning solution nozzle that supplies a cleaning solution to a center part of the substrate.

According to such an aspect, the cleaning solution can be efficiently supplied to the center part of the substrate.

A substrate processing apparatus according to a fifteenth aspect of the embodiment includes:
  a substrate polishing apparatus that polishes a substrate; and
  the substrate cleaning apparatus, according to any one of the first to fourteenth aspects, that cleans a substrate after polishing.

A substrate processing method according to a sixteenth aspect of the embodiment includes: disposing a first roll cleaning member and a second roll cleaning member each having a length almost equal to a radius of a substrate so as to cover different radial parts of a front surface of the substrate; and bringing the first roll cleaning member and the second roll cleaning member into sliding contact with the front surface of the substrate while rotating the substrate and rotating the first roll cleaning member and the second roll cleaning member about respective axes of rotation parallel to the front surface of the substrate.

Hereinafter, specific examples of an embodiment will be described in detail with reference to the accompanying drawings. Note that in the following description and the drawings used in the following description, the same reference numerals are used for parts that can be configured identically, and redundant descriptions are omitted. Furthermore, in the present specification, the expressions "above" and "below" mean expressions including not only a case where two constituent elements are in contact with each other but also a case where two constituent elements are separated from each other, unless otherwise mentioned in the present specification. Moreover, the expression "including", "having", "comprising" or "equipped with" one constituent element is not an expression excluding the presence of other constituent elements. Furthermore, unless otherwise specified, "upper" means a direction in which a first cleaning tool is present, with a substrate as a starting point, and "lower" means a direction opposite to "upper" (not only a case where a second cleaning tool is present, but also a case where the second cleaning tool is not present is assumed).

Furthermore, regarding the cleaning tool and the components constituting the cleaning tool, an "upper surface" and a "front surface" mean a surface on a side where the first cleaning tool is in contact with the substrate.

FIG. 1 is a plan view illustrating an overall configuration of a substrate processing apparatus 1 including a substrate cleaning apparatus according to one embodiment.

As illustrated in FIG. 1, the substrate processing apparatus 1 has a housing 10 having a substantially rectangular shape and a load port 12 on which a substrate cassette (not illustrated) for stocking a plurality of substrates W is placed. The load port 12 is disposed adjacent to the housing 10. On the load port 12, an open cassette, a standard manufacturing interface (SMIF) pod, or a front opening unified pod (FOUP) can be mounted. The SMIF pod and the FOUP are airtight containers that can maintain an environment independent of the external space by accommodating a substrate cassette therein and covering the substrate cassette with a partition wall. Examples of the substrate W include a semiconductor wafer or the like. However, the substrate to be processed is not limited to the semiconductor wafer, and may be other types of substrates used for manufacturing a semiconductor device, such as a glass substrate, a ceramic substrate, and the like.

A plurality of (four in the aspect illustrated in FIG. 1) polishing units (substrate polishing apparatuses) 14a to 14d that polish the substrate W, a first cleaning unit 16 and a second cleaning unit 18 that clean the substrate W after polishing, a drying unit 20 that dries the substrate W after cleaning are accommodated inside the housing 10. The polishing units 14a to 14d are arranged along the longitudinal direction of the housing 10, and the cleaning units 16 and 18 and the drying unit 20 are also arranged along the longitudinal direction of the housing 10. Furthermore, in the present embodiment, the substrate W in which no trench is present on the front surface of the substrate is targeted. Moreover, according to a configuration described later, the substrate W, which is in a state where the front surface is wet after a chemical mechanical polishing treatment as a wet treatment is performed, is directly transported to the first cleaning unit 16 without the front surface being dried, the substrate W cleaned in the first cleaning unit 16 is directly transported to the second cleaning unit 18 without being dried, the substrate W cleaned in the second cleaning unit 18 is directly transported to the drying unit 20 without being dried, and the substrate W is dried for the first time in the drying unit 20.

A first transport robot 22 is disposed in a region surrounded by the load port 12, the polishing unit 14a located on the load port 12 side, and the drying unit 20. Furthermore, a transport unit 24 is disposed between a region in which the polishing units 14a to 14d are arranged and a region in which the cleaning units 16 and 18 and the drying unit 20 are arranged, parallel to the longitudinal direction of the housing 10. The first transport robot 22 receives the substrate W before polishing from the load port 12 and transfers the substrate W to the transport unit 24, or receives, from the transport unit 24, the substrate W that is after drying and removed from the drying unit 20.

A second transport robot 26 is disposed between the first cleaning unit 16 and the second cleaning unit 18. The second transport robot 26 transfers the substrate W between the first cleaning unit 16 and the second cleaning unit 18. Furthermore, a third transport robot 28 is disposed between the second cleaning unit 18 and the drying unit 20. The third transport robot 28 transfers the substrate W between the second cleaning unit 18 and the drying unit 20.

Moreover, the substrate processing apparatus 1 is provided with a control apparatus 30 that controls the movement of each of the devices 14a to 14d, 16, 18, 20, 22, 24, 26, and 28. A programmable logic controller (PLC) is used as the control apparatus 30, for example. In the aspect illustrated in FIG. 1, the control apparatus 30 is disposed inside the housing 10, but the present invention is not limited thereto, and the control apparatus 30 may be disposed outside the housing 10.

In the example illustrated in FIG. 1, as the first cleaning unit 16, a roll cleaning apparatus is used, which brings a roll cleaning member extending in the horizontal direction into contact with the front surface of the substrate W in the presence of a cleaning solution, and scrub-cleans the front surface of the substrate W while rotating the roll cleaning member on its axis. As the second cleaning unit 18, a pencil cleaning apparatus is used, which brings a pencil cleaning member having a columnar shape extending in the vertical direction into contact with the front surface of the substrate W in the presence of a cleaning solution, and moves the pencil cleaning member toward a direction parallel to the front surface of the substrate W while rotating the pencil cleaning member on its axis to scrub-clean the front surface of the substrate W. Furthermore, as the drying unit 20, a spin drying apparatus is used, which ejects isopropyl alcohol (IPA) vapor from a spray nozzle moving in a direction parallel to the front surface of the substrate W toward the substrate W that is rotating to dry the substrate W, and further rotates the substrate W at a high speed to dry the substrate W by centrifugal force.

Note that, in the example, a roll cleaning apparatus is used as the first cleaning unit 16, but a pencil cleaning apparatus may be used as the first cleaning unit 16 similarly to the second cleaning unit 18. Alternatively, a buff polishing and cleaning apparatus may be used, which brings a buff cleaning and polishing member having a rotation axis extending in the vertical direction into contact with the front surface of the substrate W in the presence of a cleaning solution, and moves the buff cleaning and polishing member toward a direction parallel to the front surface of the substrate W while rotating the buff cleaning and polishing member on its axis to scrub-clean-polish the front surface of the substrate W. Alternatively, a two-fluid jet cleaning apparatus may be used, which cleans the front surface of the substrate W by two-fluid jet. Furthermore, in the example, a pencil cleaning apparatus is used as the second cleaning unit 18, but a roll cleaning apparatus may be used as the second cleaning unit 18 similarly to the first cleaning unit 16. Alternatively, a buff polishing and cleaning apparatus may be used, or a two-fluid jet cleaning apparatus may be used.

The cleaning solution includes a rinse solution such as deionized water (DIW) and chemical solutions such as an ammonia hydrogen peroxide solution mixture (SC1), a hydrochloric acid hydrogen peroxide solution mixture (SC2), a sulfuric acid hydrogen peroxide (SPM), a sulfuric acid dilution, and a hydrofluoric acid. In the present embodiment, the cleaning solution means either a rinse solution or a chemical solution unless stated otherwise.

Next, a substrate cleaning apparatus 40 according to one embodiment will be described with reference to FIGS. 2 to 4. The substrate cleaning apparatus 40 according to one embodiment can be applied to both the first cleaning unit 16 and the second cleaning unit 18.

Figure 2:
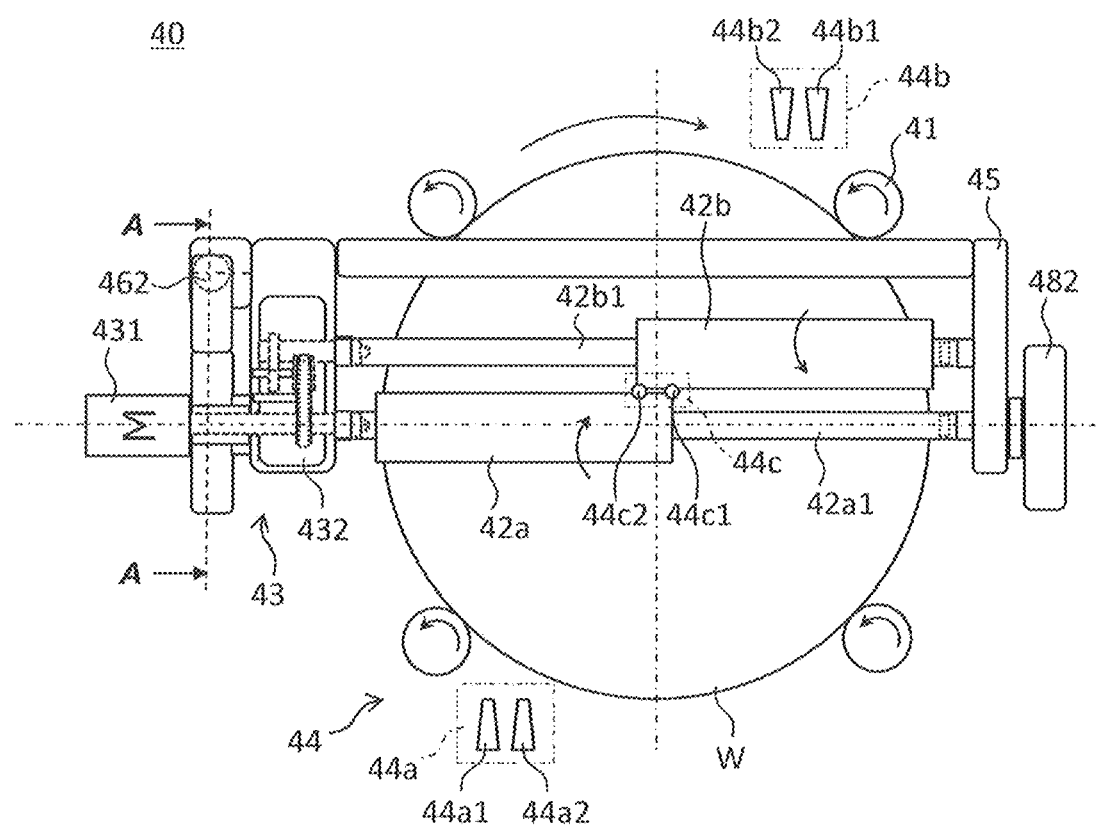
FIG. 2 is a plan view illustrating a schematic configuration of a substrate cleaning apparatus according to one embodiment.

FIG. 2 is a plan view illustrating a schematic configuration of the substrate cleaning apparatus 40 according to one embodiment. FIG. 3 is a side view of the substrate cleaning apparatus 40 according to one embodiment as viewed in a direction on the front side in FIG. 2. FIG. 4 is a side view of the substrate cleaning apparatus 40 according to one embodiment as viewed in a direction on the right side in FIG. 2.

Figure 3:
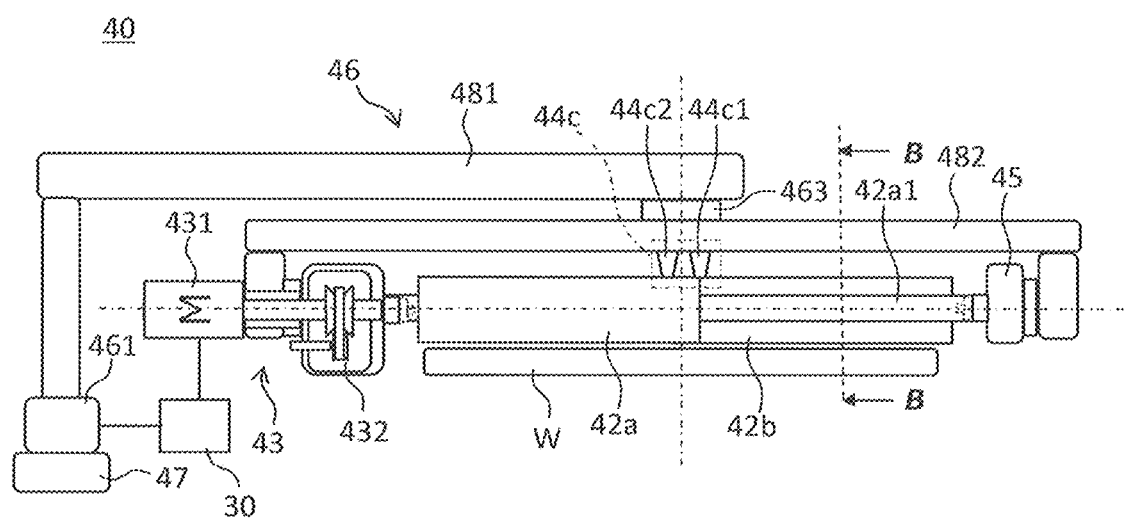
FIG. 3 is a side view of the substrate cleaning apparatus according to one embodiment as viewed in a direction on the front side in FIG. 2.
Figure 4:
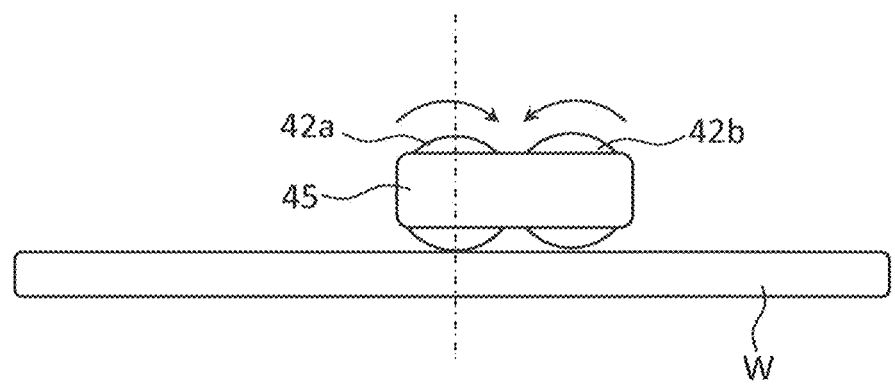
FIG. 4 is a side view of the substrate cleaning apparatus according to one embodiment as viewed in a direction on the right side in FIG. 2.

As illustrated in FIGS. 2 to 4, the substrate cleaning apparatus 40 has substrate rotation supporting sections 41 that support and rotate the substrate W, a roll holding section 45 that rotatably holds a first roll cleaning member 42a and a second roll cleaning member 42b each having a length almost equal to the radius of the substrate W, a roll rotation drive section 43 that rotates the first roll cleaning member 42a and the second roll cleaning member 42b, a roll pressing section 46 that presses the first roll cleaning member 42a and the second roll cleaning member 42b against the front surface of the substrate W, a roll parallel movement section 47 that moves the first roll cleaning member 42a and the second roll cleaning member 42b in parallel with the front surface of the substrate W, and a cleaning solution nozzle 44 that supplies a cleaning solution to the front surface of the substrate W.

Among them, as the substrate rotation supporting sections 41, a plurality of (four in the illustrated example) spin chucks that rotate while supporting the outer periphery of the substrate W are used, for example. The substrate W is held by the substrate rotation supporting sections 41 with the front surface facing upward. When the substrate rotation supporting sections 41 support and rotate the substrate W, the rotational force of the substrate rotation supporting sections 41 is transmitted to the outer side surface of the substrate W, and the substrate W rotates about its center axis (axis passing through a center O and perpendicular to the front surface of the substrate W) as the rotation axis.

The first roll cleaning member 42a and the second roll cleaning member 42b are, for example, roll sponges having a columnar shape made of polyvinyl alcohol (PVA). As illustrated in FIGS. 2 and 3, from both end parts of the first roll cleaning member 42a and the second roll cleaning member 42b in the axial direction, rotation shafts 42a1 and 42b1 extend coaxially with the respective axes of rotation, and both end parts of the respective rotation shafts 42a1 and 42b1 are rotatably held by the roll holding section 45. Note that, in the illustrated example, the first roll cleaning member 42a and the second roll cleaning member 42b are held by the same roll holding section 45, but the present invention is not limited thereto. The first roll cleaning member 42a and the second roll cleaning member 42b may be held by different roll holding sections.

As illustrated in FIGS. 2 and 3, the first roll cleaning member 42a and the second roll cleaning member 42b each have a length almost equal to the radius of the substrate W. The first roll cleaning member 42a and the second roll cleaning member 42b are disposed in a state where the respective axes of rotation are oriented in parallel with the front surface of the substrate W and so as to cover different radial parts of the front surface of the substrate W.

In the illustrated example, the axis of rotation of the first roll cleaning member 42a and the axis of rotation of the second roll cleaning member 42b are in parallel with each other, and the first roll cleaning member 42a and the second roll cleaning member 42b are disposed so as to cover opposite radial parts of the front surface of the substrate W. The axis of rotation of the first roll cleaning member 42a and the axis of rotation of the second roll cleaning member 42b are in parallel with each other, making it easy to have the same roll holding section 45 hold the first roll cleaning member 42a and the second roll cleaning member 42b, which simplifies the apparatus configuration as compared with a configuration that have different roll holding sections hold the first roll cleaning member 42a and the second roll cleaning member 42b.

The roll rotation drive section 43 rotates the first roll cleaning member 42a and the second roll cleaning member 42b about the respective axes of rotation parallel to the front surface of the substrate W. The roll rotation drive section 43 may rotate the first roll cleaning member 42a and the second roll cleaning member 42b at different rotational speeds.

In the example illustrated in FIGS. 2 and 3, the roll rotation drive section 43 has a first motor 431 that rotates the first roll cleaning member 42a, and a power transmission section 432 that transmits the rotation of the first roll cleaning member 42a to the second roll cleaning member 42b.

Among them, the first motor 431 is connected to one end part of the rotation shaft 42a1 of the first roll cleaning member 42a, and directly transmits the rotational force to the rotation shaft 42a1 of the first roll cleaning member 42a to rotate the first roll cleaning member 42a about its axis of rotation.

Figure 10:
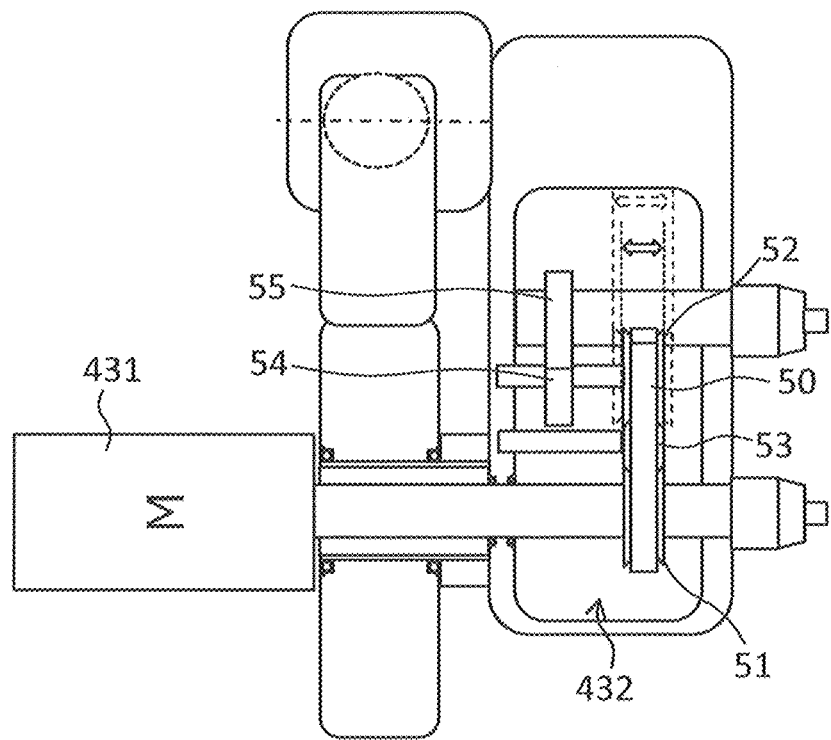
FIG. 10 is a diagram illustrating a configuration of a power transmission section that a roll rotation drive section has in an enlarged manner.
Figure 11:
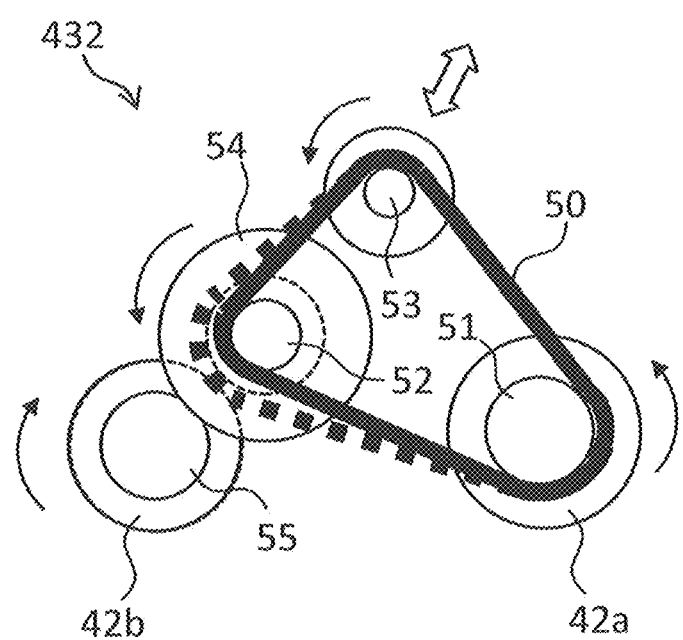
FIG. 11 is a diagram for describing an operation of the power transmission section illustrated in FIG. 10.

FIG. 10 is a diagram illustrating a configuration of the power transmission section 432 in an enlarged manner. FIG. 11 is a diagram of the power transmission section 432 as viewed in a direction on the right side in FIG. 10, for describing the operation of the power transmission section 432.

As illustrated in FIGS. 10 and 11, the power transmission section 432 has first to third pulleys 41 to 53, a belt 50 stretched over the first to third pulleys 51 to 53, and first and second gears 54 and 55.

Among them, the first pulley 51 is provided coaxially with the rotation shaft 42a1 of the first roll cleaning member 42a, and is rotatable integrally with the first roll cleaning member 42a. The belt 50 is stretched over the first to third pulleys 51 to 53. When the first roll cleaning member 42a is integrally rotated with the first pulley 51 by the rotational force from the first motor 431, the rotational force is transmitted to the second and third pulleys 52 and 53 via the belt 50, and the second and third pulleys 52 and 53 are rotated. The first gear 54 is provided coaxially with the second pulley 52, and is rotatable integrally with the second pulley 52. The second gear 55 is provided coaxially with the rotation shaft 42a1 of the second roll cleaning member 42a, and is rotatable integrally with the second roll cleaning member 42a. Furthermore, the second gear 55 meshes with the first gear 54. When the rotational force of the first roll cleaning member 42a is transmitted to the second pulley 52 via the belt 50, the second pulley 52 is rotated together with the first gear 54, the rotational force of the first gear 54 is transmitted to the second gear 55, and the second gear 55 is rotated together with the second roll cleaning member 42b. The roll rotation drive section 43 has the first motor 431 and the power transmission section 432 and hence, power can be transmitted to the two roll cleaning members 42a and 42b without installing two motors. As a result, for example, space can be saved, and the weight of the apparatus can be reduced.

In the present embodiment, the second pulley 52 is a variable speed pulley. The V-groove width, which is adjustable, of the second pulley 52 is narrowed by spring force or the like and has substantially a large diameter with no load (see the shapes of the second pulley 52 and the belt 60 indicated by broken lines in FIG. 11). The third pulley 53 is a position-adjustable tensioner pulley. When the third pulley 53 is displaced in the upward direction in FIG. 11, the belt 60 overcomes the spring force, described above, of the second pulley 52 and expands the V-groove width, causing the pulley diameter to decrease (see the shapes of the second pulley 52 and the belt 60 indicated by sold lines in FIG. 11). As the diameter of the second pulley 52 decreases, the rotational speed of the second pulley 52 and the first gear 54 increases, and thus, the rotational speed of the second gear 55 and the second roll cleaning member 42b increases (the rotational velocity increases). Therefore, the rotational speed of the first roll cleaning member 42a can be made different from the rotational speed of the second roll cleaning member 42b.

Figure 12:
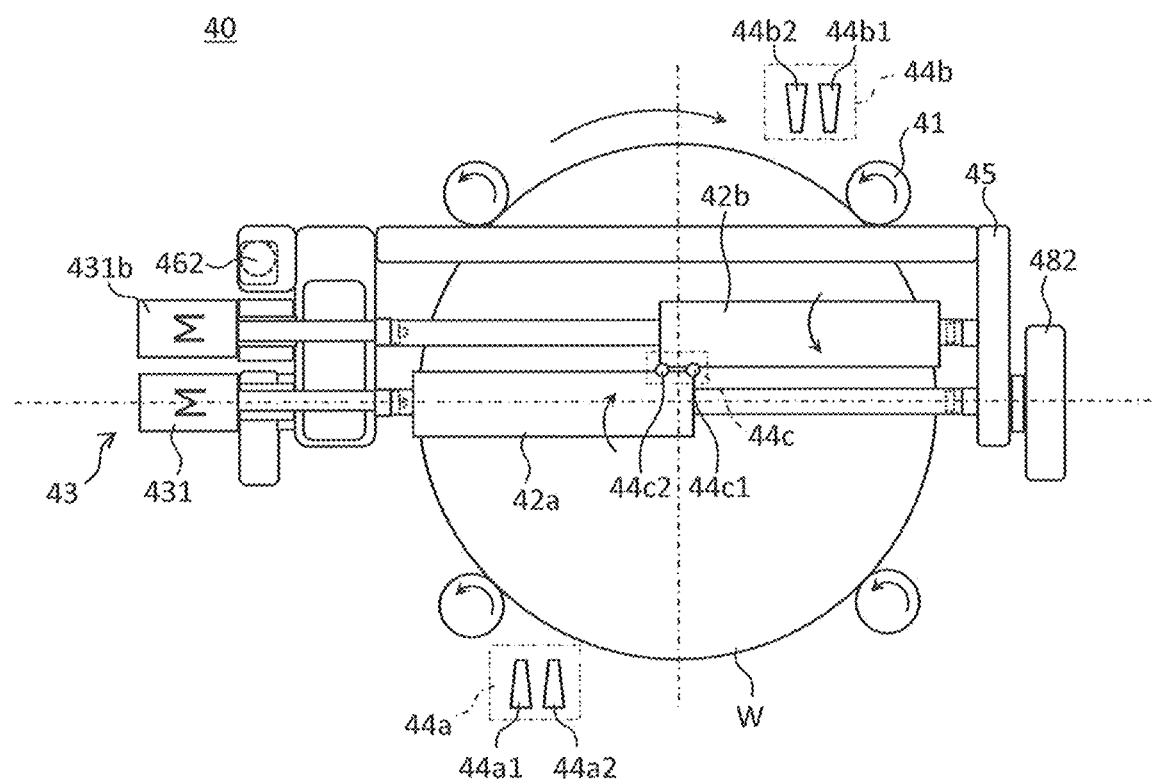
FIG. 12 is a plan view illustrating an overall configuration of a substrate processing apparatus according to a modification of one embodiment.

As a modification, as illustrated in FIG. 12, the roll rotation drive section 43 may have the first motor 431 that rotates the first roll cleaning member 42a and a second motor 431b that rotates the second roll cleaning member 42b. The first motor 431 is connected to one end part of the rotation shaft 42a1 of the first roll cleaning member 42a, and directly transmits the rotational force to the rotation shaft 42a1 of the first roll cleaning member 42a to rotate the first roll cleaning member 42a about its axis of rotation. Furthermore, the second motor 431b is connected to one end part of the rotation shaft 42b1 of the second roll cleaning member 42b, and directly transmits the rotational force to the rotation shaft 42b1 of the second roll cleaning member 42b to rotate the second roll cleaning member 42b about its axis of rotation. Also with such a configuration, the rotational speed of the first roll cleaning member 42a can be made different from the rotational speed of the second roll cleaning member 42b.

The roll pressing section 46 brings the first roll cleaning member 42a and the second roll cleaning member 42b that are rotating into sliding contact with the front surface of the substrate W.

In the example illustrated in FIGS. 2 and 3, the roll pressing section 46 has a first pressing section 461 and a second pressing section 462.

The first pressing section 461 brings the first roll cleaning member 42a and the second roll cleaning member 42b into sliding contact with the front surface of the substrate W by applying a load to the roll holding section 45 in a direction perpendicular to the front surface of the substrate W.

In the illustrated example, the first pressing section 461 is an actuator, and is connected to a proximal end part of a first arm section 481 extending in the horizontal direction. A second arm section 482 is supported at a distal end part of the first arm section 481 so that the second arm section 482 is suspended from the distal end part, and the second arm section 482 holds the roll holding section 45. When the first pressing section 461 applies a vertically downward load to the first arm section 471, the load is transmitted from the first arm section 481 to the roll holding section 45 via the second arm section 482, and the first roll cleaning member 42a and the second roll cleaning member 42b are pressed against and brought into sliding contact with the front surface of the substrate W.

As illustrated in FIG. 3, a pressing load detector 463 is provided between the first arm section 481 and the second arm section 482. The pressing load detector 463 detects pressing loads of the first roll cleaning member 42a and the second roll cleaning member 42b with respect to the front surface of the substrate W. The control apparatus 30 described above adjusts the pressing load of the first pressing section 461 on the basis of the detection result of the pressing load detector 463

The second pressing section 462 makes the pressing load of the first roll cleaning member 42a different from the pressing load of the second roll cleaning member 42b with respect to the front surface of the substrate W by tilting the roll holding section 45 with respect to the front surface of the substrate W.

Figure 5:
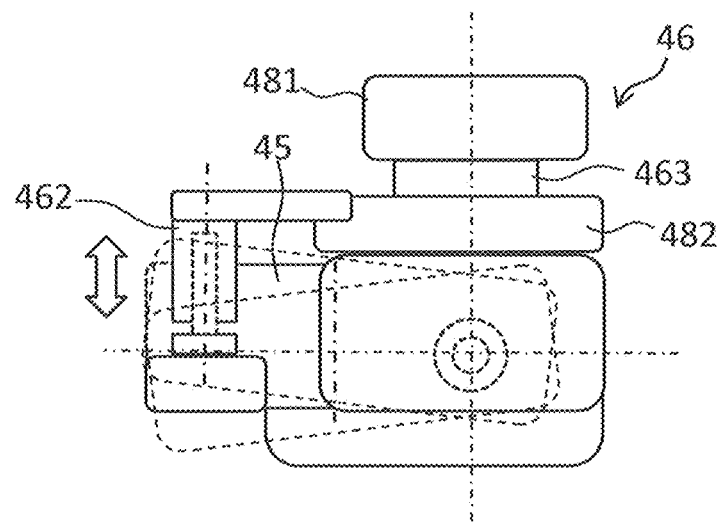
FIG. 5 is a diagram illustrating a cross section of the substrate cleaning apparatus according to one embodiment taken along line A-A illustrated in FIG. 2.
Figure 6:
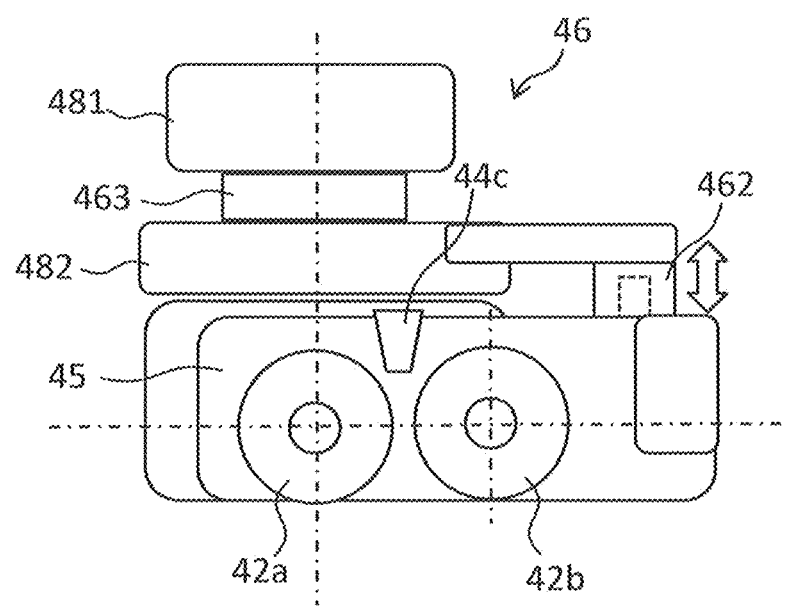
FIG. 6 is a diagram illustrating a cross section of the substrate cleaning apparatus according to one embodiment taken along line B-B illustrated in FIG. 3.

FIG. 5 is a diagram illustrating a cross section of the substrate cleaning apparatus 40 taken along line A-A illustrated in FIG. 2. FIG. 6 is a diagram illustrating a cross section of the substrate cleaning apparatus 40 taken along line B-B illustrated in FIG. 3.

Figure 7:
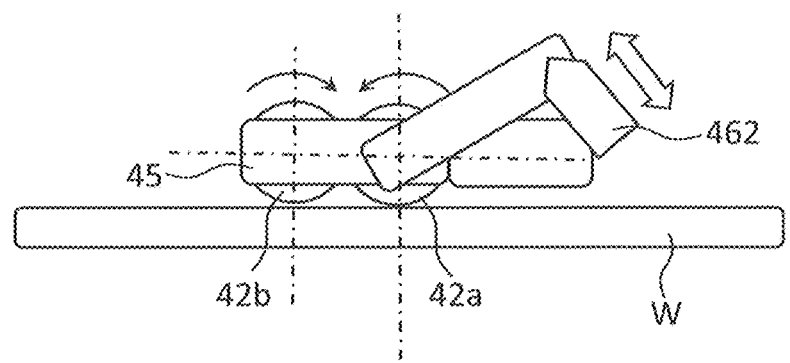
FIG. 7 is a diagram for describing an operation of a second pressing section.
Figure 8:
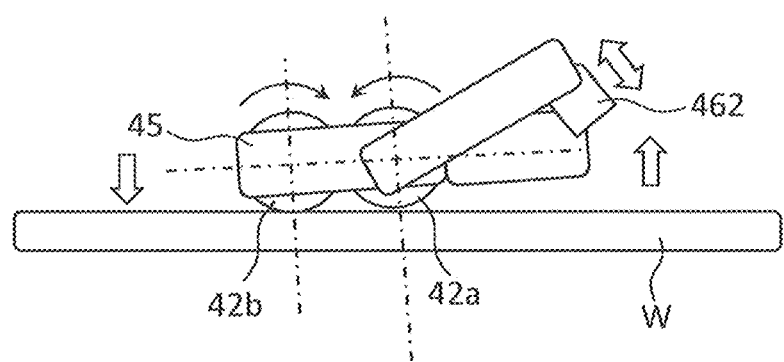
FIG. 8 is a diagram for describing an operation of the second pressing section.

In the example illustrated in FIGS. 5 and 6, the second pressing section 462 is an extendable and contractible actuator, and is provided to be extendable and contractible in the up-down directions at a position displaced from the rotation axis of the first roll cleaning member 42a on the roll holding section 45. As illustrated in FIG. 7, at a point of time before the second pressing section 462 contracts, the roll holding section 45 does not tilt with respect to the front surface of the substrate W, and the load from the first pressing section 461 received by the roll holding section 45 is evenly distributed to the first roll cleaning member 42a and the second roll cleaning member 42b. Therefore, the first roll cleaning member 42a and the second roll cleaning member 42b are pressed against the front surface of the substrate W with the same pressing load. On the other hand, as illustrated in FIG. 8, when the second pressing section 462 contracts, a right end part of the roll holding section 45 is pulled upward by the second pressing section 462, and a distance between the substrate and the right end part (first end part) of the roll holding section 45 is increased. At this time, a left end part (second end part) of the roll holding section 45 is pushed down, and the roll holding section 45 tilts with respect to the front surface of the substrate W. The pressing load of the second roll cleaning member 42b disposed on the relatively left side is larger than the pressing load of the first roll cleaning member 42a. The pressing load of the first roll cleaning member 42a can be made different from the pressing load of the second roll cleaning member 42b with respect to the front surface of the substrate W and hence, it is possible to realize a removal action that depends on the adhesion force of the particles due to the difference in pressing loads of the roll cleaning members 42a and 42b with respect to the substrate W, and to immediately remove the particles re-adhered to the substrate from the roll cleaning members 42a and 42b. Therefore, the particle removal ability can be improved.

That is, the inventors have found that the particles having a relatively large adhesion force are easily removed under a high load and a low rotational velocity condition, and the particles having a relatively small adhesion force are easily removed under a low load and a high rotational velocity condition. Note that, in the present specification, tilting the roll holding section 45 with respect to the front surface of the substrate W means creating a state where the distance between the substrate and the right end part or the left end part (first end part) of the roll holding section 45 is increased, and at the same time, the distance between the substrate and the other end part (second end part) of the roll holding section 45 is decreased.

With reference to FIG. 2, the control apparatus 30 automatically controls the voltage applied to the motor in the control apparatus 30 such that the first motor 431 maintains the motor rotational velocity constant even with a minute variation in load torque. Therefore, for example, the first motor 431 is provided with a torque calculator (not illustrated) that calculates load torque of the motor from a drive current of the motor, and the control apparatus 30 receives a signal of the load torque of the motor output from the torque calculator. In addition, the control apparatus 30 has a storage section (not illustrated) that stores a predetermined upper limit value and a predetermined lower limit value of the load torque of the first motor 431, and an arithmetic section (not illustrated) that reads data from the storage section and performs computations. The control apparatus 30 receives (from the torque calculator) the signal of the load torque of the first motor 431, and compares the signal with the upper limit value and the lower limit value stored in the storage section. Then, in a case where the load torque of the first motor 431 exceeds the preset upper limit value, the control apparatus 30 computes a distance corresponding to a difference between the upper limit value and the load torque of the first motor 431 on the basis of a predetermined calculation formula or a table, and controls the roll pressing section 46 so as to separate the first roll cleaning member 42a and the second roll cleaning member 42b from the substrate W by the distance. On the other hand, in a case where the load torque of the first motor 431 falls below the preset lower limit value, the control apparatus 30 computes a distance corresponding to a difference between the lower limit value and the load torque of the first motor 431 on the basis of a predetermined calculation formula or a table, and controls the roll pressing section 46 so as to bring the first roll cleaning member 42a and the second roll cleaning member 42b close to the substrate W by the distance. Accordingly, by keeping the load torque of the first motor 431 within a predetermined certain fixed range, the pressing situation of the roll cleaning members 42a and 42b with respect to the front surface of the substrate W can be kept within a certain fixed range and hence, stable cleaning performance can be maintained.

As a modification, as illustrated in FIG. 12, in a case where the roll rotation drive section 43 has the first motor 431 that rotates the first roll cleaning member 42a and the second motor 431b that rotates the second roll cleaning member 42b, the first motor 431 and the second motor 431b may each be provided with a torque calculator (not illustrated) that calculates the load torque of the motor from the drive current of the motor, and the control apparatus 30 may have a storage section (not illustrated) that stores a predetermined first upper limit value and a predetermined first lower limit value for the load torque of the first motor 431 and stores a predetermined second upper limit value and a predetermined second lower limit value for the load torque of the second motor 431b, and an arithmetic section (not illustrated) that reads data from the storage section and performs computations. In this case, the control apparatus 30 receives (from the torque calculators) the signal of the load torque of each of the first motor 431 and the second motor 431b, compares the load torque of the first motor 431 with the first upper limit value and the first lower limit value stored in the storage section, and compares the load torque of the second motor 431b with the second upper limit value and the second lower limit value stored in the storage section. Then, in a case where the load torque of the first motor 431 exceeds the preset first upper limit value, the control apparatus 30 computes a distance corresponding to a difference between the first upper limit value and the load torque of the first motor 431 on the basis of a predetermined calculation formula or a table, and controls the roll pressing section 46 so as to separate the first roll cleaning member 42a from the substrate W by the distance. On the other hand, in a case where the load torque of the first motor 431 falls below the preset first lower limit value, the control apparatus 30 computes a distance corresponding to a difference between the first lower limit value and the load torque of the first motor 431 on the basis of a predetermined calculation formula or a table, and controls the roll pressing section 46 so as to bring the first roll cleaning member 42a close to the substrate W by the distance. Furthermore, in a case where the load torque of the second motor 431b exceeds the preset second upper limit value, the control apparatus 30 computes a distance corresponding to a difference between the second upper limit value and the load torque of the second motor 431b on the basis of a predetermined calculation formula or a table, and controls the roll pressing section 46 so as to separate the second roll cleaning member 42b from the substrate W by the distance. On the other hand, in a case where the load torque of the second motor 431b falls below the preset second lower limit value, the control apparatus 30 computes a distance corresponding to a difference between the second lower limit value and the load torque of the second motor 431b on the basis of a predetermined calculation formula or a table, and controls the roll pressing section 46 so as to bring the second roll cleaning member 42b close to the substrate W by the distance. Accordingly, by keeping the load torque of the first motor 431 and the second motor 431b within a predetermined certain fixed range, the pressing situation of the roll cleaning members 42a and 42b with respect to the front surface of the substrate W can be kept within a certain fixed range and hence, stable cleaning performance can be maintained.

Although not illustrated, a third roll cleaning member having a normal length (that is, a length almost equal to the diameter of the substrate W) may be disposed on the back surface side of the substrate W, and the back surface of the substrate W may also be contact-cleaned by the third roll cleaning member while the front surface of the substrate W is being contact-cleaned by the first roll cleaning member 42a and the second roll cleaning member 42b. In this case, the pressing load of the third roll cleaning member may be configured to be adjusted on the basis of a value of the load torque of a third motor that rotates the third roll cleaning member.

As illustrated in FIG. 2, the roll rotation drive section 43 rotates the first roll cleaning member 42a and the second roll cleaning member 42b in such a direction that the sliding direction of the first roll cleaning member 42a is opposite to the sliding direction of the substrate W at the sliding contact interface between the first roll cleaning member 42a and the substrate W and the sliding direction of the second roll cleaning member 42b is opposite to the sliding direction of the substrate W at the sliding contact interface between the second roll cleaning member 42b and the substrate W. For example, in a case where the substrate W is rotated clockwise about the center axis when viewed from above by the substrate rotation supporting sections 41, the roll rotation drive section 43 rotates the first roll cleaning member 42a and the second roll cleaning member 42b clockwise about the respective axes of rotation when viewed from the center side of the substrate W. Conversely, in a case where the substrate W is rotated counterclockwise about its center axis when viewed from above by the substrate rotation supporting sections 41, the roll rotation drive section 43 rotates the first roll cleaning member 42a and the second roll cleaning member 42b counterclockwise about the respective axes of rotation when viewed from the center side of the substrate W.

As a comparative example, in a case where the sliding direction of the roll cleaning member is in the same direction as the sliding direction of the substrate W at the sliding contact interface between the roll cleaning member and the substrate W, the roll cleaning member acts to sweep the particles, on the substrate W that is moving away, up toward the substrate, and acts to wind up the particles, on the substrate W that is approaching, onto the substrate. Therefore, the roll cleaning member hardly contributes to cleaning of the substrate and, to the contrary, has an effect of causing re-adhesion of particles to the substrate W from the roll cleaning member. On the other hand, in the case where the sliding direction of the first roll cleaning member 42a is opposite to the sliding direction of the substrate W at the sliding contact interface between the first roll cleaning member 42a and the substrate W and the sliding direction of the second roll cleaning member 42b is opposite to the sliding direction of the substrate W at the sliding contact interface between the second roll cleaning member 42b and the substrate W, the first roll cleaning member 42a and the second roll cleaning member 42b act to face the particles on the substrate W that is approaching and sweep the particles up and away. Therefore, the particle removal ability can be improved.

Figure 9:
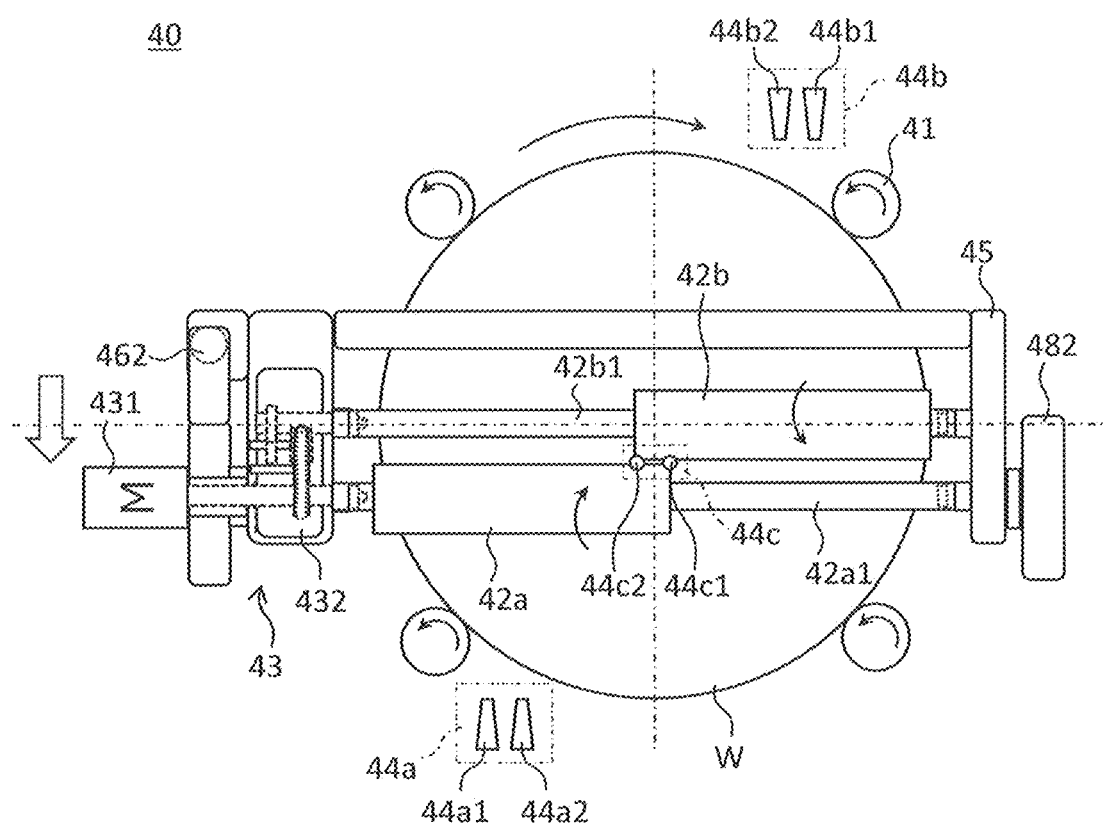
FIG. 9 is a diagram for describing an operation of a roll parallel movement section.

With reference to FIGS. 2 and 9, the roll parallel movement section 47 integrally moves the first roll cleaning member 42a and the second roll cleaning member 42b in a direction parallel to the front surface of the substrate W. The roll parallel movement section 47 may move the first roll cleaning member 42a and the second roll cleaning member 42b in directions (up-down directions in FIGS. 2 and 9) orthogonal to the respective axes of rotation, may move the first roll cleaning member 42a and the second roll cleaning member 42b in directions (left-right directions in FIGS. 2 and 9) parallel to the respective axes of rotation, or may move the first roll cleaning member 42a and the second roll cleaning member 42b in a circular motion by moving them in directions (up-down directions in FIGS. 2 and 9) orthogonal to the respective axes of rotation as well as in directions (left-right directions in FIGS. 2 and 9) parallel to the respective axes of rotation.

With reference to FIG. 2, the cleaning solution nozzle 44 supplies a cleaning solution to the front surface of the substrate W. In the example illustrated in FIG. 2, the cleaning solution nozzle 44 has a first cleaning solution nozzle 44a that supplies a cleaning solution to the sliding contact interface between the first roll cleaning member 42a and the substrate W, a second cleaning solution nozzle 44b that supplies a cleaning solution to the sliding contact interface between the second roll cleaning member 42b and the substrate W, and a third cleaning solution nozzle 44c that supplies a cleaning solution to the center part of the substrate W.

As illustrated in FIG. 2, the first cleaning solution nozzle 44a may supply the cleaning solution to the sliding contact interface between the first roll cleaning member 42a and the substrate W from the upstream side in the rotation direction of the substrate W. Furthermore, the second cleaning solution nozzle 44b may supply the cleaning solution to the sliding contact interface between the second roll cleaning member 42b and the substrate W from the upstream side in the rotation direction of the substrate W.

In the example illustrated in FIG. 2, the first cleaning solution nozzle 44a has a first chemical solution nozzle 44a1 that supplies a chemical solution to the sliding contact interface between the first roll cleaning member 42a and the substrate W, and a first rinse solution nozzle 44a2 that supplies a rinse solution. The first chemical solution nozzle 44a1 and the first rinse solution nozzle 44a2 may each be a spray nozzle or a single tube nozzle. Furthermore, the second cleaning solution nozzle 44b has a second chemical solution nozzle 44b1 that supplies a chemical solution to the sliding contact interface between the second roll cleaning member 42b and the substrate W, and a second rinse solution nozzle 44b2 that supplies a rinse solution. The second chemical solution nozzle 44b1 and the second rinse solution nozzle 44b2 may each be a spray nozzle or a single tube nozzle. Furthermore, the third cleaning solution nozzle 44c has a third chemical solution nozzle 44c1 that supplies a chemical solution to the center part of the substrate W, and a third rinse solution nozzle 44c2 that supplies a rinse solution. The third chemical solution nozzle 44c1 and the third rinse solution nozzle 44c2 may each be a spray nozzle or a single tube nozzle. Note that, in the present specification, the "spray nozzle" refers to a nozzle that has a large number of supply ports and sprays a cleaning solution so as to spatially spread the cleaning solution, and the "single tube nozzle" refers to a nozzle that has a single supply port and relatively linearly discharges a cleaning solution from the supply port, unlike the spray nozzle.

Next, an example of a substrate cleaning method by the substrate cleaning apparatus 40 having such a configuration will be described.

First, the substrate W, which is an object to be cleaned, is held by the substrate rotation supporting sections 41 with the front surface facing upward. Next, the first roll cleaning member 42a and the second roll cleaning member 42b are disposed so as to cover different radial parts of the front surface of the substrate W. That is, in the present embodiment, as illustrated in FIG. 2, the first roll cleaning member and the second roll cleaning member are disposed such that an angle formed by the axis of rotation of the first roll cleaning member having an elongated shape with a length approximately corresponding to the radius of the substrate and the axis of rotation of the second roll cleaning member having an elongated shape with a length approximately corresponding to the radius of the substrate is parallel (180 degrees), and the first roll cleaning member and the second roll cleaning member cover different radial parts of the same front surface of the substrate.

Then, the substrate rotation supporting sections 41 rotate the substrate W about its axis of rotation, and the roll rotation drive section 43 rotates the first roll cleaning member 42a and the second roll cleaning member 42b about the respective axes of rotation parallel to the front surface of the substrate W.

Next, while the cleaning solution nozzle 44 supplies a cleaning solution to the front surface of the substrate W, the roll pressing section 46 presses the first roll cleaning member 42a and the second roll cleaning member 42b against the front surface of the substrate W to bring the first roll cleaning member 42a and the second roll cleaning member 42b into sliding contact with the front surface of the substrate W. The front surface of the substrate W is to be cleaned twice by the first roll cleaning member 42a and the second roll cleaning member 42b during a single rotation and hence, the particle removal ability can be significantly improved as compared with the configuration disclosed in JP 2002-313767 A.

The roll rotation drive section 43 may rotate the first roll cleaning member 42a and the second roll cleaning member 42b in such a direction that the sliding direction of the first roll cleaning member 42a is opposite to the sliding direction of the substrate W at the sliding contact interface between the first roll cleaning member 42a and the substrate W and the sliding direction of the second roll cleaning member 42b is opposite to the sliding direction of the substrate W at the sliding contact interface between the second roll cleaning member 42b and the substrate W. In this case, the first roll cleaning member 42a and the second roll cleaning member 42b that are rotating act to face the particles on the substrate W that is approaching and sweep the particles up and away. Therefore, the particle removal ability can be further improved.

The roll rotation drive section 43 may rotate the first roll cleaning member 42a and the second roll cleaning member 42b at different rotational speeds. In this case, the relative velocity at the sliding contact interface between the first roll cleaning member 42a and the substrate W can be made different from the relative velocity at the sliding contact interface between the second roll cleaning member 42b and the substrate W. Accordingly, it is possible to realize a removal action that depends on the size of the particles, and to immediately remove the particles re-adhered to the substrate W from the roll cleaning members 42a and 42b. Therefore, the particle removal ability can be further improved.

The roll pressing section 46 may make the pressing load of the first roll cleaning member 42a different from the pressing load of the second roll cleaning member 42b with respect to the front surface of the substrate W by tilting the roll holding section 42 with respect to the front surface of the substrate W by the operation of the second pressing section 462. In this case, it is possible to realize a removal action that depends on the size of the particles due to the difference in pressing loads of the roll cleaning members 42a and 42b with respect to the substrate W, and to immediately remove the particles re-adhered to the substrate W from the roll cleaning members 42a and 42b. Therefore, the particle removal ability can be further improved.

The roll parallel movement section 47 may integrally move the first roll cleaning member 42a and the second roll cleaning member 42b in a direction parallel to the front surface of the substrate in a state where the first roll cleaning member 42a and the second roll cleaning member 42b are in sliding contact with the front surface of the substrate W. In this case, even if the axes of rotation of the roll cleaning members 42a and 42b are not disposed to overlap with the diameter of the substrate W in a plan view, the roll cleaning members 42a and 42b can be brought into sliding contact with the center part of the substrate W by performing cleaning while reciprocating the roll cleaning members 42a and 42b in a direction orthogonal to the axes of rotation of the roll cleaning members 42a and 42b. Therefore, the center part of the substrate W can also be cleaned evenly.

Furthermore, in the conventional apparatus, cleaning is performed only in an arrangement in which the axis of rotation of the roll cleaning member is disposed to overlap with the diameter of the substrate W in a plan view. Therefore, the position of nodules (bumps) provided on the outer circumference of the surface of the roll cleaning member takes a fixed position in distance from the center of the substrate W in the radial direction, and the number of contacts of the nodules is unevenly distributed depending on the position in the radial direction. Therefore, the particle removal ability varies depending on the distance from the center of the substrate W in the radial direction. On the other hand, in the present embodiment, cleaning is performed while reciprocating the roll cleaning members 42a and 42b, by the roll parallel movement section 47, in a direction orthogonal to the axes of rotation of the roll cleaning members 42a and 42b. Therefore, the position of nodules provided on the outer circumference of the surface of the roll cleaning members 42a and 42b varies in distance from the center of the substrate W in the radial direction, and uneven distribution of the number of contacts of the nodules depending on the position in the radial direction is suppressed, and the time until the end of cleaning can be relatively shortened.

When the cleaning solution nozzle 44 supplies a cleaning solution to the front surface of the substrate W, the first cleaning solution nozzle 44a may supply a cleaning solution to the sliding contact interface between the first roll cleaning member 42a and the substrate W from the upstream side of the substrate W in the rotation direction, and the second cleaning solution nozzle 44b may supply a cleaning solution to the sliding contact interface between the second roll cleaning member 42b and the substrate W from the upstream side of the substrate W in the rotation direction. In this case, the cleaning solution can be more efficiently supplied to the sliding contact interface between each of the roll cleaning members 42a and 42b and the substrate W, and the particle removal ability can be further improved.

After completion of the cleaning, the control apparatus 30 controls the roll pressing section 46 so as to separate the first roll cleaning member 42a and the second roll cleaning member 42b from the front surface of the substrate W. Here, at the time of separating the cleaning members from the substrate, when two cleaning members are simultaneously separated from the substrate, there is a concern that reverse contamination occurs. In such a case, for example, the control apparatus 30 controls the roll pressing section 46 so as to separate the roll cleaning member having a longer accumulated use time out of the first roll cleaning member 42a and the second roll cleaning member 42b from a first surface (front surface) of the substrate W first, and then to separate the roll cleaning member having a shorter accumulated use time from the first surface (front surface) of the substrate W next. By performing such processing, a concern such as reverse contamination on the substrate W can be reduced. Furthermore, as described above, in a case where the back surface of the substrate W is contact-cleaned by the third roll cleaning member while the front surface of the substrate W is being contact-cleaned by the first roll cleaning member 42a and the second roll cleaning member 42b, and also in a case where there is a concern that particles from the front surface of the substrate W move to the back surface side, or the like, the control apparatus 30 controls, after completion of the cleaning, the roll pressing section 46 so as to separate the roll cleaning member having a longer accumulated use time out of the first roll cleaning member 42a and the second roll cleaning member 42b from the first surface (front surface) of the substrate W first, and then to separate the roll cleaning member (third roll cleaning member described above) on a second surface (back surface) of the substrate W from the substrate W next, and finally to separate the roll cleaning member having a relatively shorter accumulated use time on the first surface (front surface) from the first surface (front surface) of the substrate. Accordingly, the cleanability on the first surface (front surface) side can be ensured, and at the same time, the cleanability on the second surface (back surface) side can be ensured.

The separation of either the first roll cleaning member 42a or the second roll cleaning member 42b from the first surface (front surface) of the substrate W prior to the other can be realized by, for example, extending or contracting the second pressing section 462 of the roll pressing section 46.

As one mode of the substrate cleaning method, the first roll cleaning member 42a may be pressed against the substrate W with a relatively high load while being rotated at a relatively low speed, and the second roll cleaning member 42b may be pressed against the substrate W with a relatively low load while being rotated at a relatively high speed. It has been found in the study of the inventors that contamination with large adhesion force (for example, particles made of highly adhesive components) can be cleaned well at a low rotational velocity and with a high pressing load in general, whereas this condition potentially increases reverse contamination from the roll cleaning member. The configuration described above can remove particles that try to re-adhere to the substrate W or re-adhered particles by the second roll cleaning member 42b while exhibiting high contamination removal ability on the first roll cleaning member 42a. Moreover, by separating the first roll cleaning member 42a from the substrate W first, and separating the second roll cleaning member 42b from the substrate W thereafter, cleaning can be completed under the cleaning condition with less risk of re-adhesion of particles, which is advantageous. Alternatively, before separating the roll cleaning member from the substrate W at the end of the cleaning processing, both the roll cleaning members may be operated at a high rotational velocity and with a low pressing load for a short period of time to suppress the reverse contamination.

According to the present embodiment described above, the first roll cleaning member 42a and the second roll cleaning member 42b each having a length almost equal to the radius of the substrate W are disposed so as to cover different radial parts of the front surface of the substrate W. Accordingly, by bringing the first roll cleaning member 42a and the second roll cleaning member 42b into sliding contact with the front surface of the substrate W while rotating each of the substrate W, the first roll cleaning member 42a, and the second roll cleaning member 42b, the front surface of the substrate W is to be cleaned twice by the first roll cleaning member 42a and the second roll cleaning member 42b during a single rotation. Therefore, the particle removal ability can be significantly improved.

Furthermore, according to the present embodiment, the first roll cleaning member 42a and the second roll cleaning member 42b are rotated in such a direction that the sliding direction of the first roll cleaning member 42a is opposite to the sliding direction of the substrate W at the sliding contact interface between the first roll cleaning member 42a and the substrate W and the sliding direction of the second roll cleaning member 42b is opposite to the sliding direction of the substrate W at the sliding contact interface between the second roll cleaning member 42b and the substrate W. Accordingly, the first roll cleaning member 42a and the second roll cleaning member 42b that are rotating act to face the particles on the substrate W that is approaching and sweep the particles up and away. Therefore, the particle removal ability can be further improved.

Furthermore, according to the present embodiment, the first roll cleaning member 42a and the second roll cleaning member 42b are rotated at different rotational speeds. Therefore, the relative velocity at the sliding contact interface between the first roll cleaning member 42a and the substrate W can be made different from the relative velocity at the sliding contact interface between the second roll cleaning member 42b and the substrate W. Accordingly, it is possible to realize a removal action that depends on the size of the particles, and to immediately remove the particles re-adhered to the substrate W from the roll cleaning members 42a and 42b. Therefore, the particle removal ability can be further improved.

Furthermore, according to the present embodiment, the pressing load of the first roll cleaning member 42a is made different from the pressing load of the second roll cleaning member 42b with respect to the front surface of the substrate W by tilting the roll holding section 45 with respect to the front surface of the substrate W, and the front surface of the substrate W can be scrub-cleaned with the first roll cleaning member and the second roll cleaning member. Accordingly, a removal action that depends on the magnitude of the adhesion force of the particles on the surface of the substrate can be realized due to the difference in pressing loads of the roll cleaning members 42a and 42b with respect to the substrate W. Furthermore, for example, it can be expected that the particles re-adhered to the substrate due to the strong pressing load of the first roll cleaning member are removed by the second roll cleaning member having a smaller pressing load than the first roll cleaning member. As a result, it is possible to immediately remove the particles re-adhered to the substrate W from the roll cleaning members 42a and 42b without providing another cleaning process, and an improved particle removal ability can be achieved without reducing throughput.

Furthermore, according to the present embodiment, the roll cleaning members 42a and 42b can be brought into sliding contact with the center part of the substrate W by performing cleaning while reciprocating the roll cleaning members 42a and 42b in a direction orthogonal to the axes of rotation of the roll cleaning members 42a and 42b even if the axes of rotation of the roll cleaning members 42a and 42b are not disposed to overlap with the diameter of the substrate W in a plan view. Therefore, the center part of the substrate W can also be cleaned evenly. Furthermore, the position of nodules provided on the outer circumference of the surface of the roll cleaning members 42a and 42b varies in distance from the center of the substrate W in the radial direction and hence, uneven distribution of the number of contacts of the nodules depending on the position in the radial direction is suppressed, and the time until the end of cleaning can be relatively shortened.

The embodiment and the modification have been described above by way of example, but the scope of the present technology is not limited thereto, and can be changed and modified according to the object within the scope described in the claims. Furthermore, each of the embodiment and the modification can be appropriately combined within a scope in which the processing contents do not contradict each other.

What is claimed is:

1. A substrate cleaning method, comprising:
providing a roll holding section that rotatably holds a first roll cleaning member and a second roll cleaning member having a length almost equal to a radius of a substrate,
disposing the first roll cleaning member and second roll cleaning member so as to cover different radial parts of a front surface of the substrate;
bringing the first roll cleaning member and the second roll cleaning member into sliding contact with the front surface of the substrate by applying a load to the roll holding section in a direction perpendicular to the front surface of the substrate, wherein the first roll cleaning member and second roll cleaning member are brought into sliding contact with the front surface while rotating the substrate and rotating the first roll cleaning member and the second roll cleaning member about respective axes of rotation parallel to the front surface of the substrate; and
making a pressing load of the first roll cleaning member different from a pressing load of the second roll cleaning member with respect to the front surface of the substrate by tilting the roll bolding section with respect to the front surface of the substrate when viewed in a direction parallel to the axes of rotation.

2. The substrate cleaning method according to claim 1, wherein the roll holding section is tilted such that the respective axes of rotation of the first roll cleaning member and the second roll cleaning member remain parallel to the front surface of the substrate.

3. The substrate cleaning method according to claim 1, wherein the roll holding section is tilted about an axis parallel to the front surface of the substrate.

4. A substrate processing apparatus comprising:
a substrate polishing apparatus configured to polish a substrate; and
a substrate cleaning apparatus comprising: a substrate rotation supporting section that supports and is configured to rotate a substrate; a roll holding section that rotatably holds a first roll cleaning member and a second roll cleaning member each having a length almost equal to a radius of the substrate; a roll rotation drive section configured to rotate the first roll cleaning member and the second roll cleaning member about respective axes of rotation parallel to a front surface of the substrate; and a roll pressing section configured to bring the first roll cleaning member and the second roll cleaning member that are rotating into sliding contact with the front surface of the substrate, wherein the roll pressing section has a first pressing section configured to bring the first roll cleaning member and the second roll cleaning member into sliding contact with the front surface of the substrate by applying a load to the roll holding section in a direction perpendicular to the front surface of the substrate, and a second pressing section configured to make a pressing load of the first roll cleaning member different from a pressing load of the second roll cleaning member with respect to the front surface of the substrate by tilting the roll holding section with respect to the front surface of the substrate when viewed in a direction parallel to the axes of rotation, wherein the first roll cleaning member and the second roll cleaning member are disposed so as to cover different radial parts of the front surface of the substrate, wherein the substrate cleaning apparatus is configured to clean the substrate after polishing.

5. A substrate cleaning apparatus comprising:
a substrate rotation supporting section that supports and is configured to rotate a substrate;
a roll holding section that rotatably holds a first roll cleaning member and a second roll cleaning member each having a length almost equal to a radius of the substrate;
a roll rotation drive section configured to rotate the first roll cleaning member and the second roll cleaning member about respective axes of rotation parallel to a front surface of the substrate; and
a roll pressing section configured to bring the first roll cleaning member and the second roll cleaning member that are rotating into sliding contact with the front surface of the substrate, wherein the roll pressing section has:
a first pressing section configured to bring the first roll cleaning member and the second roll cleaning member into sliding contact with the front surface of the substrate by applying a load to the roll holding section in a direction perpendicular to the front surface of the substrate, and
a second pressing section configured to make a pressing load of the first roll cleaning member different from a pressing load of the second roll cleaning member with respect to the front surface of the substrate by tilting the roll holding section with respect to the front surface of the substrate when viewed in a direction parallel to the axes of rotation,
wherein the first roll cleaning member and the second roll cleaning member are disposed so as to cover different radial parts of the front surface of the substrate.

6. The substrate cleaning apparatus according to claim 5, wherein the roll rotation drive section rotates the first roll cleaning member and the second roll cleaning member in such a direction that a sliding direction of the first roll cleaning member is opposite to a sliding direction of the substrate at a sliding contact interface between the first roll cleaning member and the substrate and a sliding direction of the second roll cleaning member is opposite to a sliding direction of the substrate at a sliding contact interface between the second roll cleaning member and the substrate.

7. The substrate cleaning apparatus according to claim 5, wherein an axis of rotation of the first roll cleaning member and an axis of rotation of the second roll cleaning member are in parallel with each other, and the first roll cleaning member and the second roll cleaning member are disposed so as to cover opposite radial parts of the front surface of the substrate across a center of the substrate.

8. The substrate cleaning apparatus according to claim 5, wherein the roll rotation drive section rotates the first roll cleaning member and the second roll cleaning member at different rotational speeds.

9. The substrate cleaning apparatus according to claim 5, wherein
the roll rotation drive section has a motor that rotates the first roll cleaning member and the second roll cleaning member,
the substrate cleaning apparatus has a control apparatus that controls the roll pressing section, and
the control apparatus receives a signal of load torque of the motor, and controls the roll pressing section, in a case where the load torque of the motor exceeds a preset upper limit value, so as to separate the first roll cleaning member and the second roll cleaning member from the substrate by a distance corresponding to a difference between the upper limit value and the load torque of the motor, and in a case where the load torque of the motor falls below a preset lower limit value, so as to bring the first roll cleaning member and the second roll cleaning member close to the substrate by a distance corresponding to a difference between the lower limit value and the load torque of the motor.

10. The substrate cleaning apparatus according to claim 5, wherein the roll rotation drive section has a first motor that rotates the first roll cleaning member, and a power transmission section that transmits rotation of the first roll cleaning member to the second roll cleaning member.

11. The substrate cleaning apparatus according to claim 5, further comprising a roll parallel movement section that integrally moves the first roll cleaning member and the second roll cleaning member in a direction parallel to the front surface of the substrate.

12. The substrate cleaning apparatus according to claim 5, wherein the second pressing section is configured to tilt the roll holding section such that the respective axes of rotation of the first roll cleaning member and the second roll cleaning member remain parallel to the front surface of the substrate.

13. The substrate cleaning apparatus according to claim 5, wherein the second pressing section is configured to tilt the roll holding section about an axis parallel to the front surface of the substrate.

14. The substrate cleaning apparatus according to claim 5, wherein the roll rotation drive section has a first motor that rotates the first roll cleaning member, and a second motor that rotates the second roll cleaning member.

15. The substrate cleaning apparatus according to claim 14, further comprising a control apparatus that receives a signal of load torque of each of the first motor and the second motor, and controls the roll pressing section, in a case where the load torque of the first motor exceeds a preset first upper limit value, so as to separate the first roll cleaning member from the substrate by a distance corresponding to a difference between the first upper limit value and the load torque of the first motor, in a case where the load torque of the first motor falls below a preset first lower limit value, so as to bring the first roll cleaning member close to the substrate by a distance corresponding to a difference between the first lower limit value and the load torque of the first motor, in a case where the load torque of the second motor exceeds a preset second upper limit value, so as to separate the second roll cleaning member from the substrate by a distance corresponding to a difference between the second upper limit value and the load torque of the second motor, and in a case where the load torque of the second motor falls below a preset second lower limit value, so as to bring the second roll cleaning member close to the substrate by a distance corresponding to a difference between the second lower limit value and the load torque of the second motor.

16. The substrate cleaning apparatus according to claim 5, further comprising a cleaning solution nozzle that supplies a cleaning solution to the front surface of the substrate.

17. The substrate cleaning apparatus according to claim 16, wherein the cleaning solution nozzle has a third cleaning solution nozzle that supplies a cleaning solution to a center part of the substrate.

18. The substrate cleaning apparatus according to claim 16, wherein the cleaning solution nozzle has a first cleaning solution nozzle that supplies a cleaning solution to the sliding contact interface between the first roll cleaning member and the substrate, and a second cleaning solution nozzle that supplies a cleaning solution to the sliding contact interface between the second roll cleaning member and the substrate.

19. The substrate cleaning apparatus according to claim 18, wherein
the first cleaning solution nozzle supplies the cleaning solution to the sliding contact interface between the first roll cleaning member and the substrate from an upstream side of the substrate in a rotation direction, and
the second cleaning solution nozzle supplies the cleaning solution to the sliding contact interface between the second roll cleaning member and the substrate from the upstream side of the substrate in the rotation direction.

* * * * *